United States Patent [19]

Kawarada et al.

[11] 4,228,525
[45] Oct. 14, 1980

[54] SEMICONDUCTOR INTEGRATED CIRCUIT DEVICE

[75] Inventors: Kuniyasu Kawarada, Musashino; Masao Suzuki, Kodaira; Chikai Ono, Kawasaki; Kazuhiro Toyoda, Yokohama, all of Japan

[73] Assignees: Nippon Telegraph and Telephone Public Corporation, Tokyo; Fujitsu Limited, Kanagawa, both of Japan

[21] Appl. No.: 38,016

[22] Filed: May 11, 1979

[30] Foreign Application Priority Data

May 11, 1978 [JP] Japan .................................. 53-56007
Mar. 2, 1979 [JP] Japan .................................. 54-24983

[51] Int. Cl.² ............................................. G11C 11/40
[52] U.S. Cl. .................................. 365/174; 365/210; 307/238

[58] Field of Search .................... 365/174, 189, 210; 307/238, 279

[56] References Cited

U.S. PATENT DOCUMENTS

3,959,781  5/1976  Mehta et al. ........................ 365/210

Primary Examiner—Terrell W. Fears
Attorney, Agent, or Firm—Staas & Halsey

[57] ABSTRACT

A semiconductor integrated circuit device has an array of memory cells formed by integrated injection logic. A desired number of dummy cells are provided at both ends of each line of the array, so that a write current, which flows when the memory cell near the dummy cell is selected, is shunted by the dummy cell, thereby the currents which flow in the memory cells in the line of the memory array are equalized.

19 Claims, 19 Drawing Figures

SEMICONDUCTOR INTEGRATED CIRCUIT DEVICE

FIELD OF THE INVENTION

The present invention relates to a semiconductor integrated circuit memory device wherein memory cells formed by integrated injection logic are arranged as a memory array.

BACKGROUND OF THE INVENTION

At present, memory cells which are constituted by integrated injection logic are elements of paramount importance, because such memory cells can be formed with high integration density. Such memory cells are disclosed, for example, in the articles "Write Current Control and Self Powering in a Low Power Memory Cell", IEEE, SSC, June, 1973, and "Superintegrated Memory Shares Functions on Diffused Islands", Electronics, Feb. 14, 1972, p83–p86. The former discloses a method of controlling a write current to the integrated injection logic memory cell and the latter discloses a basic idea with respect to the integrated injection logic memory cell.

As disclosed in the above mentioned articles, the integrated injection logic memory cell comprises a pair of first and second transistors which have emitters forming an injector which is connected to a word line W+, and said first and second transistors have a first conductivity type, a pair of third and fourth transistors which have collectors respectively connected to the collectors of the first and second transistors, the base of the third transistor being connected to the collector of said fourth transistor and the base of the fourth transistor being connected to the collector of said third transistor, and which have a second conductivity type, and a bulk that is a word line W— which is connected to the bases of the first and second transistors and to the emitters of the third and fourth transistors.

The integrated injection logic memory cells are arranged as the memory array. In these integrated injection logic memory cells, the word line W— is formed as the bulk, as already mentioned, and this bulk usually consists of two n type layers, an epitaxial layer and a buried layer. The epitaxial layer is formed on the buried layer which has a higher density of the impurity than the epitaxial layer. Therefore, the bulk, that is, the word line W— has a larger resistance than a metallic wire, and this resistance exists between each cell.

When the bulk is used as the word line W— which supplies the hold current, the characteristics of the cells are different in accordance with the positions of the cells in the line of the array. Especially, a write threshold current and the width of a write pulse have large values in cells near the end of the array.

OBJECTS AND SUMMARY OF THE INVENTION

An object of the present invention is to equalize the characteristics of the integrated injection logic memory cells which are arranged as a memory array.

Another object of the present invention is to equalize the write threshold current and the width of the write pulse for the integrated injection logic memory cells which are arranged as a memory array.

The above-mentioned objects can be achieved by a semiconductor integrated circuit device of a memory array which is formed by integrated injection logic memory cells, said integrated injection logic memory cells each including an injector which is connected to a first word line and which forms a p (or n) type conduction region, a pair of first and second pnp (npn) transistors having common emitters formed by said injector, a pair of third and fourth npn (pnp) transistors having collectors connected to the collectors of said first and second transistors, respectively, the base of the third transistor being connected to the collector of the fourth transistor and the base of the fourth transistor being connected to the collector of the third transistor, and a bulk which is formed as a common n (p) type conduction region of the bases of said first and second transistor and the emitters of said third and fourth transistors, said bulk being connected to a second word line, and fifth and sixth npn (pnp) transistors having collectors connected to said second word line, bases connected to said third and fourth transistors, respectively, and emitters connected respectively to first and second bit lines, the semiconductor integrated circuit device comprising dummy cells at the ends of each line of said memory array, so that a write current which flows when a memory cell near said dummy cell is selected is shunted by said dummy cell.

Further features and advantages of the present invention will be apparent from the ensuing description with reference to the accompanying drawings to which, however, the scope of the invention is in no way limited.

DETAILED EXPLANATION OF THE INVENTION

Figure 1A:
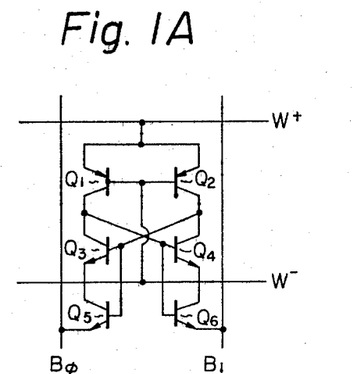
FIGS. 1A, 1B and 1C illustrate equivalent circuits of a memory cell corresponding to one bit of a memory array formed by an integrated injection logic memory cell.
Figure 2:
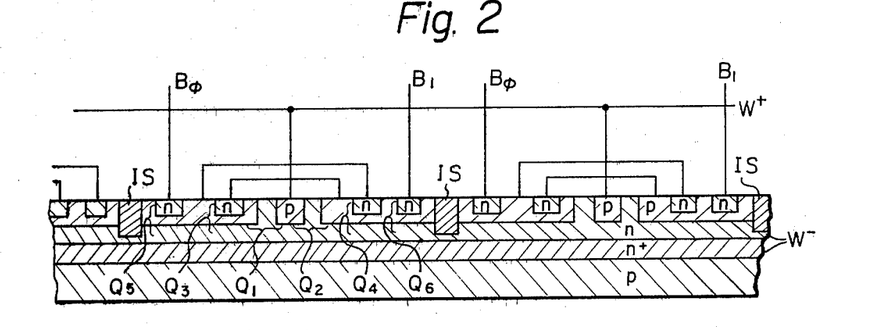
FIG. 2 illustrates a cross section of the memory array formed by the integrated injection logic memory cell.

FIG. 1A is an illustration of an equivalent circuit corresponding to one memory cell which is formed by integrated injection logic. In FIG. 1A, $Q_1$ through $Q_6$ designate transistors, W+ and W— designate word lines and $B_1$, $B\phi$ designate bit lines, respectively. FIG. 2 illustrates a cross sectional view of the memory array formed by the integrated memory cells shown in FIG.

1. In FIG. 2, symbols which are the same as in FIG. 1 designate corresponding parts to those illustrated in FIG. 1.

Referring to FIGS. 1A and 2, a p type conduction region which is connected to the word line W+ is an injector, and the p type conduction region is actuated as common emitters of lateral pnp transistors $Q_1$, $Q_2$. This is understood when FIG. 2 is compared with FIG. 1A. As illustrated in FIGS. 1A and 2, the transistors $Q_1$ and $Q_2$ are used as loads, the usual collector regions of npn transistors $Q_3$ and $Q_4$ are connected to a word line W− and used as emitters and the usual emitter regions of npn transistors $Q_3$ and $Q_4$ are used as collectors. Therefore, a bulk, that is an n type conduction region, which is commonly used as the bases of the pnp transistors $Q_1$, $Q_2$ and as the emitters of the npn transistors $Q_3$, $Q_4$, can be used as a buried word line W−, so that the cells can be formed in a high density.

Figure 1B:
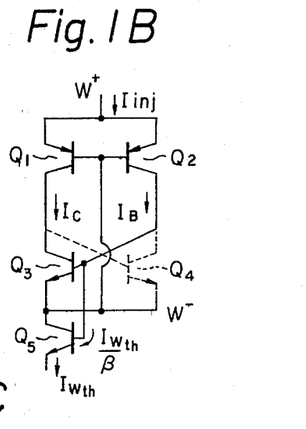

Referring to the memory cell shown in FIG. 1A, transistors $Q_3$ and $Q_4$ are placed in the on and off state alternately. When the transistor $Q_3$ is placed in the on state, the transistor $Q_4$ is placed in the off state. FIG. 1B illustrates an equivalent circuit of FIG. 1A when the transistor $Q_3$ is placed in the on state. An injection current Iinj supplies a base current of an on state transistor $Q_3$. In order to change the cell information, the on state transistor $Q_3$ should be changed to the off state. This is done by bypassing the base current $I_B$ of the transistor $Q_3$ to the base current of a coupling transistor $Q_5$ the emitter current of which corresponds to write threshold current Iwth.

Figure 1C:
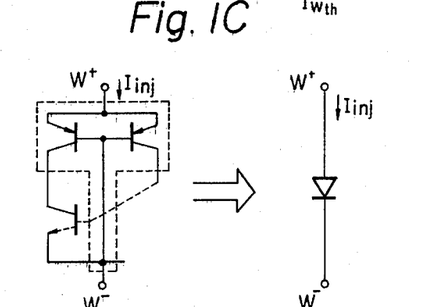

The write threshold current Iwth depends on the injection current Iinj. FIG. 1C shows that an equivalent circuit of a memory cell which is not selected may be replaced by an equivalent diode.

Figure 3A:
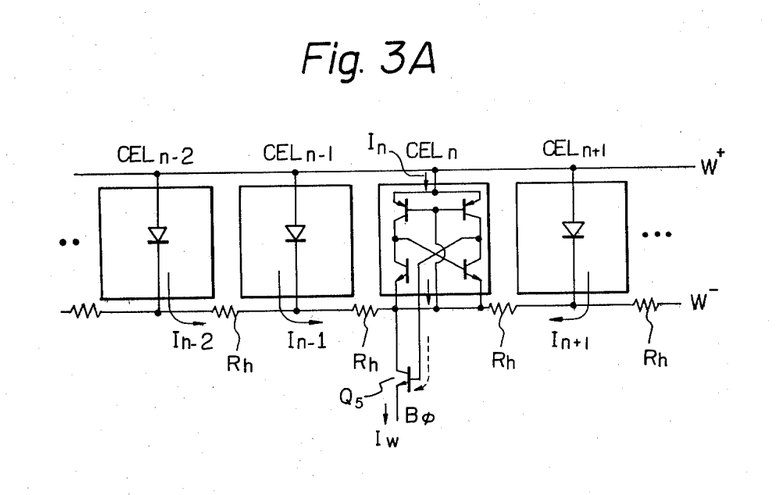
FIGS. 3A, 3B, 3C and 3D illustrate equivalent circuits of conventional integrated injection memory cells arranged on one line of the conventional memory array and the characteristics of the memory cell used in the conventional memory array.
Figure 3B:
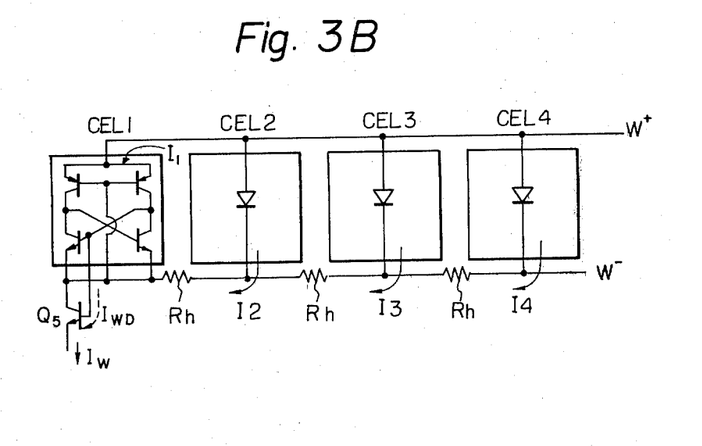

FIGS. 3A and 3B illustrate equivalent circuits of one row of a random access memory cell array which is constituted by using the memory cells shown in FIGS. 1A and 2. Referring to FIGS. 3A and 3B, $CEL_1$, $CEL_2$, ..., $CEL_{n-1}$, $CEL_n$, $CEL_{n+1}$ designate a first, a second, ... an n-1th, an n'th, and an n+1th cell, respectively. FIG. 3A illustrates the case where the $CEL_n$ in a middle portion of the line is selected, and FIG. 3B illustrates the case where the $CEL_1$ at the end of the line is selected. In FIGS. 3A and 3B, the word line W− is formed as the bulk, as already mentioned, and the bulk is usually formed by the n+ buried layer and n epitaxial layer. The bulk, that is, the word line W−, has a larger resistance than the metallic wire and, therefore, a resistance RH exists between each two adjacent cells.

Figure 3C:
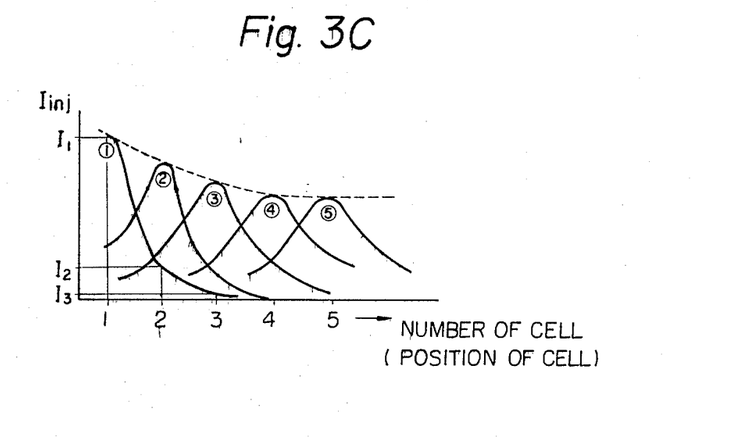
Figure 3D:
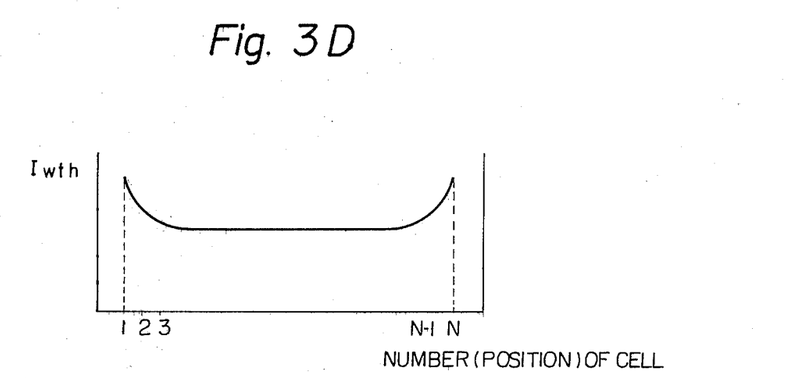

When the bulk is used as the word line W− for supplying a hold current, the characteristics of the cells vary due to the resistance of the bulk, in accordance with the position of the cells in the line. Especially, a large write threshold current which is proportional to the injection current and a wide width of the write pulse are required in the cell near the end of the line. FIG. 3C illustrates a relation between the injection current Iinj and the position of the cell, and FIG. 3D illustrates a relation between the write threshold current and the position of the cell. Referring to FIG. 3C and 3D, the ordinate designates the injection current and the write threshold current, respectively, and the abscissa designates the cell number or the position of the cell.

When information is written in the selected n'th cell $CEL_n$ indicated in FIG. 3A, the write current Iw is supplied to either one of the bit lines $B_1$, $B\phi$ through the coupling transistor $Q_5$. However, in this case, the write current Iw flows in other non-selected cells, besides the n'th cells $CEL_n$, as an injector current. This phenomenon can be understood from the fact that, each cell $CEL_{n-1}$, $CEL_n$, $CEL_{n+1}$ can be equivalently represented as an injector diode which is connected to the word line W−. The current which flows in the non-selected cells decreases exponentially, due to the resistance of the word line, from the n'th $CEL_n$. Therefore, in this case, the currents In−1, In+1 which flow in the n−1th cell and the n+1th cell respectively, are most dominant as a shunt current. That is, the current In which flows in the nth cell $CEL_n$ is affected by the currents In−1, In+1 which flow in the n−1th cell and the n+1th cell respectively. However, when the first cell $CEL_1$ which is positioned at the end of the array is going to be written, the write current Iw is shunted only at one side, such as cell $CEL_2$. That is, when the information is written in the cell positioned at the end of the array, the write current Iw is not shunted at the other side, so that, therefore, the injector current in the cell where the information is written increases. In FIG. 3C, the curve ① shows the distribution of the injector current $I_1$, $I_2$, $I_3$, ... in FIG. 3B when the write current Iw flows through the $CEL_1$. When we assume that the value of the write current is constant, the injector current which flows in the selected cell positioned at the end of the array when the information is written is larger than the injector current which flows in the selected cell not positioned at the end of the array. Further, as the write threshold current is proportional to the injector current, the write threshold current in the cell positioned at the end of the array is larger than the write threshold current in the cell not positioned at the end of the array. When the write threshold current is large, if we assume that the write current is constant, a charge and discharge current for inverting the state of the cell is not sufficient, so that a write pulse having wide width is required.

As will be understood from the above discussion, when the characteristics of the cell depends on the position of the cell, the design margin is narrow, and therefore, the random access memory characteristics deteriorate.

Figure 4A:
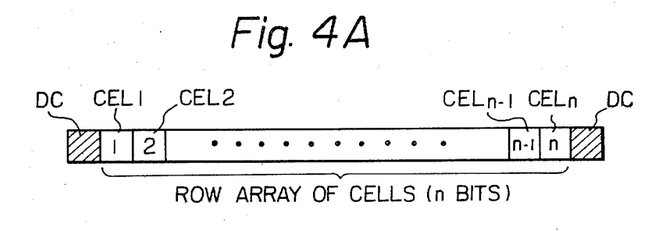
FIGS. 4A, 4B and 4C illustrate a equivalent circuits of an embodiment of semiconductor integrated circuit device and the characteristics of the memory cell used in the memory array according to the present invention.
Figure 4B:
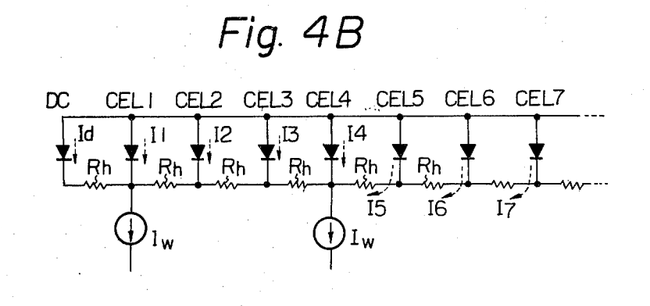
Figure 4C:
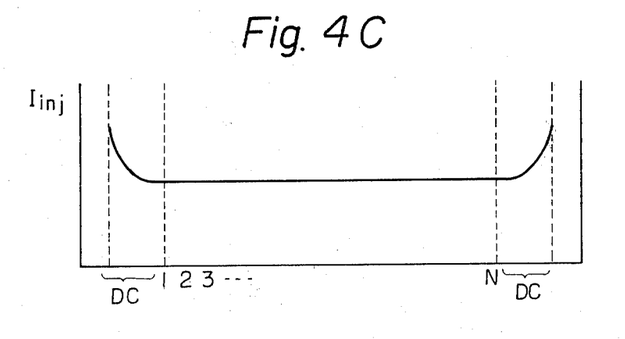

The basic idea of the present invention is very simple. As seen in FIGS. 4A and 4B, n cells, $CEL_1$, $CEL_2$, ..., $CEL_n$, are arranged as an n bit array, and in the present invention, dummy cells DC are arranged at both ends of the array. When information is written in the cell $CEL_1$ or $CEL_n$ positioned at the ends of the array, the write current is shunted by the dummy cell DC, so that an increase of the write threshold current or the width of the write pulse in the cells positioned at the end of the array can be prevented. FIG. 4C represents the relation between the injection current Iinj and the position of the cells which include the dummy cells. In FIG. 4C, the ordinate designates the injection current Iinj, and the abscissa designates the number of the cells and dummy cells positioned at the end of the array.

Figure 5A:
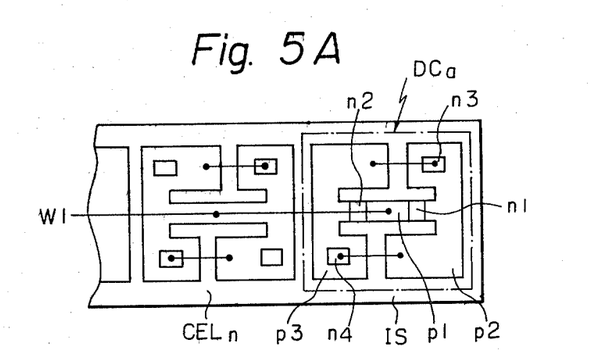
FIGS. 5A, 5B and 5C illustrate three embodiments of the semiconductor integrated circuit device according to the present invention.
Figure 5B:
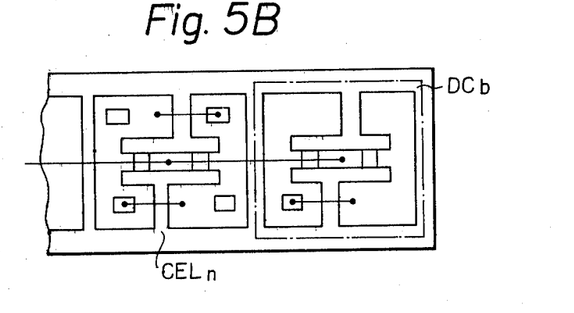
Figure 5C:
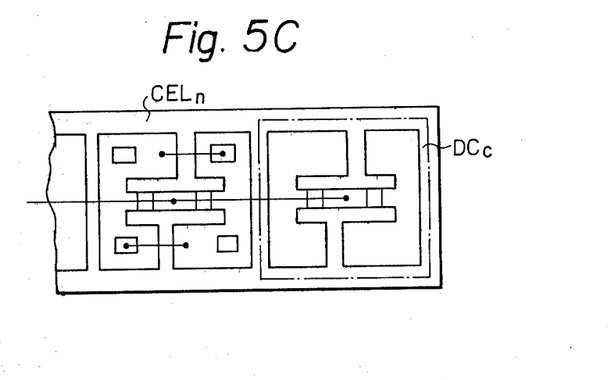

FIGS. 5A, 5B and 5C illustrate first embodiments of the semiconductor integrated circuit device according to the present invention. In FIGS. 5A, 5B and 5C, the area of the injector in the dummy cell is equal to the area of the injector in the memory cell. In FIG. 5A, IS designates an isolation region, $DC_a$ the dummy cell, $CEL_n$ a memory cell and $W_1$ the word line; $p_1$ designates a p type region which forms the common emitter of the transistor $Q_1$ and $Q_2$ of the memory cell; $n_1$ and $n_2$ are n type regions of the semiconductor layer which form the bases of the transistor $Q_1$ and $Q_2$; $p_2$ is a p type region which forms the collector of the transistor $Q_1$ and the bases of the transistors $Q_3$ and $Q_5$; $p_3$ is a p type region which forms the collector of the transistor $Q_2$ and the bases of the transistors $Q_4$ and $Q_6$; $n_3$ designates an n type region which forms the collector of the transistor $Q_3$; and $n_4$ is an n type region which forms an emitter of the transistor $Q_4$. Therefore, in FIG. 5A, the dummy cell is formed by the transistors $Q_1$, $Q_2$, $Q_3$ and $Q_4$ in correspondence with the respective portions of the memory cell. In FIG. 5B, the dummy cell $DC_b$ is formed by transitors $Q_1$, $Q_2$ and $Q_3$, and in FIG. 5C, the dummy cell $DC_c$ is formed by an injector diode. In the dummy cells illustrated in FIG. 5B and 5C, the same effect can be obtained as in the dummy cell illustrated in FIG. 5A. However, in the embodiments illustrated in FIGS. 5A, 5B and 5C, as the shunt current into the dummy cell is inversely proportional to the value of the resistor Rh, a large value for the resistance Rh makes the write threshold current Iwth high. Therefore, in such a case, more than one dummy cell is required to equalize the cell characteristics. If we assume that the memory capacity is constant, the area of the chip of the memory device increases when a number of dummy cells are arranged at the end of the line of the memory array.

Figure 6A:
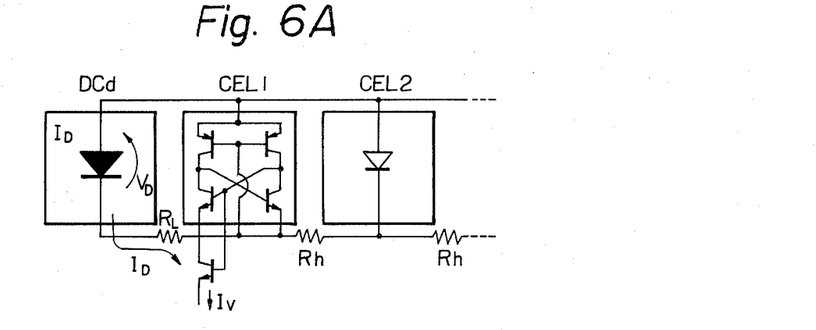
FIGS. 6A, 6B and 6C illustrate equivalent circuits of an embodiment of another semiconductor integrated circuit device and the characteristics of the memory cell used in the memory array according to the present invention.
Figure 6B:
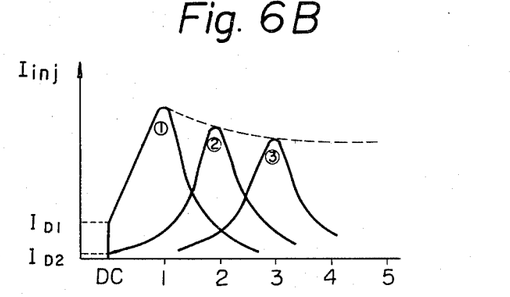
Figure 6C:
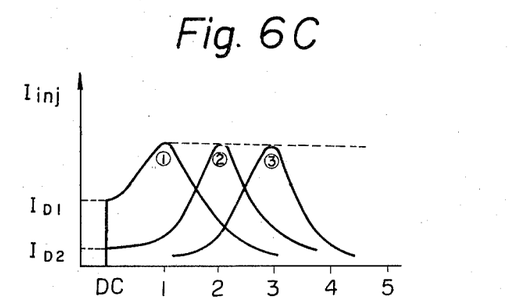

FIGS. 6A is an embodiment which can remove the above inconvenience caused in the embodiments illustrated in FIGS. 5A, 5B and 5C. In FIG. 6A, $DC_d$ designates a dummy cell, and the injector area of the dummy cell $DC_d$ is selected so that it is larger than that of memory cells $CEL_1$, $CEL_2$. According to experiments conducted by the inventors of the present invention, when the dummy cell has a wide injector area, the value of the injection current of the memory cells can be equalized. FIGS. 6B and 6C illustrate the relation between the injection current of the memory cells and the number of memory cells. In FIGS. 6B and 6C the ordinate designates the injection current of the memory cells and the abscissa designates the number of memory cells. When the area of the injector region of the dummy cell is small, the value of the injection currents of the memory cells can not be sufficiently equalized, as shown in FIG. 6B. However, when the area of the injector region of the dummy cell is sufficiently large, the currents $I_{D1}$ and $I_{D2}$ which are shunted by the dummy cell increase so that the value of the injection currents of the memory cells can be sufficiently equalized, as shown in FIG. 6C.

Figure 7A:
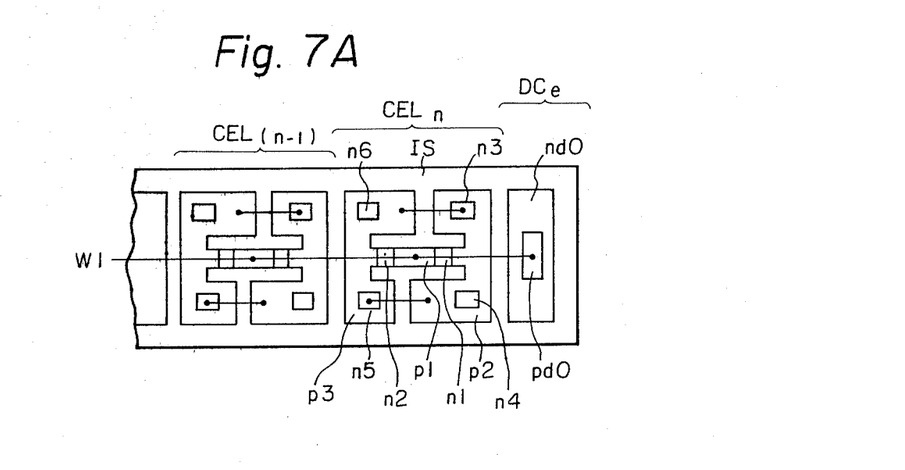
FIGS. 7A and 7B illustrate two embodiments of the semiconductor integrated circuit of the memory array illustrated in FIG. 6A.
Figure 7B:
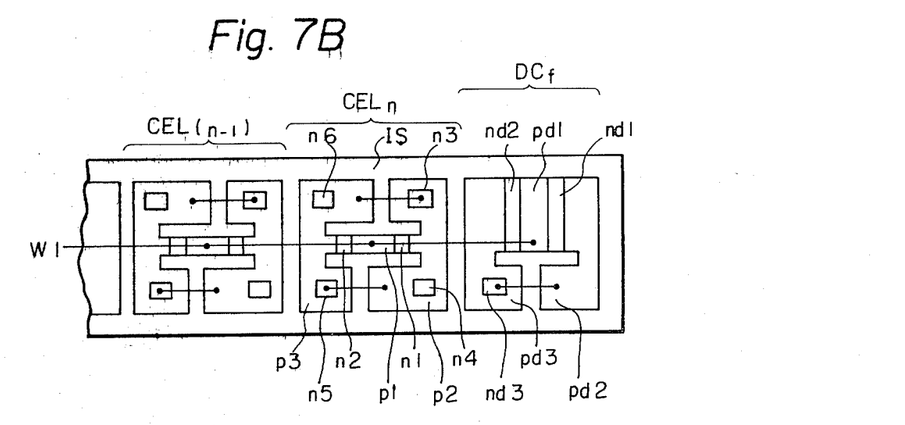

FIGS. 7A and 7B illustrate second embodiments of the semiconductor integrated circuit device according to the present invention. In the embodiments illustrated in FIGS. 7A and 7B, the area of the injector of the dummy cell is larger than the area of the injector in the memory cell, and the memory cells $CEL_{n-1}$, $CEL_n$ are the same as the memory cells used in the embodiments illustrated in FIGS. 5A, 5B and 5C.

In the embodiment shown in FIG. 7A, pd0 designates a p type region when the injector of the dummy cell is formed by the diode and nd0 designates an n type region, that is, the dummy cell $DC_e$ is formed by the equivalent diode which is illustrated in FIG. 6A, and the area of the injector region is formed so as to equalize the write threshold currents of the memory cells. In the embodiment illustrated in FIG. 7A, by using the diode construction in the dummy cell, the regions corresponding to the collectors of the transistors $Q_1$, $Q_2$ and the transistors $Q_3$ through $Q_4$ can be eliminated. Therefore, the area of the dummy cells can be decreased, even if the area of the injector region is increased, and the deterioration of the integration density is very small.

In the embodiment illustrated in FIG. 7B, $DC_f$ designates a dummy cell. In the dummy cell $DC_f$, $pd_1$ designates a p type region which forms the emitter of the injector of the dummy cell $DC_f$ corresponding to the emitters of the transistors $Q_1$, $Q_2$; $nd_1$, $nd_2$ designate n type regions which form the base of the injector and corresponding to the bases of the transistors $Q_1$, $Q_2$; $pd_2$ designates a p type region which corresponds to the collector of the transistor $Q_1$; $pd_3$ designates a p type region which corresponds to the collector of the transistor $Q_2$ and the base of the transitor $Q_3$ and; $nd_3$ designates an n type region which corresponds to the collector of the transistor $Q_3$. In the embodiment of FIG. 7B, the dummy cell $DC_f$ is formed by the transistors $Q_1$, $Q_2$, $Q_3$ in the memory cell and the area of the injector region of the dummy cell is larger than that of the memory cell, so that the area of the dummy cells can be decreased even if the area of the injection region is increased.

As illustrated above, in the semiconductor integrated circuit device wherein the memory cell formed by injection integrated logic is arranged according to the present invention, the write threshold current in the memory cell at the end of the array is shunted to the dummy cell, so that the write threshold current in each memory cell can be equalized, and the characteristics of the memory cell can be improved.

What is claimed is:

1. A semiconductor integrated circuit device having an array of integrated injection logic memory cells, each said cell comprising first and second transistors of first conduction type with emitters connected in common to form an injector of said cell, third and fourth transistors of a second conduction type opposite said first type having their collectors respectively connected to the collectors of said first and second transistors, said third transistor having its base is connected to said collector of said fourth transistor and said fourth transistor having its base connected to said collector of said third transistor, and said first and second transistors having their bases connected in common with the emitters of said third and fourth transistors; said device comprising a first word line connecting said injectors of said cell,
a second word line comprising a bulk portion of said semiconductor of said device selectively connected to said commonly connected bases of said first and second transistors and said emitters of said third and fourth transistors, and
at least one dummy cell at each end of each said of said array, each said dummy cell comprising means for shunting a respective portion of a write current which flows when one of said integrated injection logic memory cells near said dummy cell is selected.

2. A semiconductor integrated circuit device according to claim 1, each said integrated injection logic memory cell comprising a pair of fifth and sixth transistors of said second conduction type with their bases respectively connected to the bases of said third and fourth transistors of the cell, collectors connected to the second word line connected to the cell, and emitters respectively connected to said first and second bit lines connected to the cell.

3. A semiconductor integrated circuit device according to claim 1, at least one of said dummy cells comprising an injector having an area equal to at least that of said integrated injection logic cells in the vicinity of said at least one dummy cell.

4. A semiconductor integrated circuit device according to claim 3, said at least one dummy cell having the same pattern as that of said integrated injection logic memory cells in the vicinity of said at least one dummy cell.

5. A semiconductor integrated circuit device according to claim 3, said at least one dummy cell comprising a first, second and third transistors of the same pattern as those of each said integrated injection logic memory cell in the vicinity of said at least one dummy cell.

6. A semiconductor integrated circuit device according to claim 3, said at least one dummy cell comprising a diode connected between the first and second word lines.

7. A semiconductor integrated circuit device according to claim 1, at least one of said dummy cells comprising an injector having a larger area than that of said integrated injection logic memory cells in the vicinity of said at least one dummy cell.

8. A semiconductor integrated circuit device according to claim 7, said at least one dummy cell comprising a diode connected between said first word line and said second word line.

9. A semiconductor integrated circuit device according to claim 7, said at least one dummy cell comprising a first region of said first conduction type (p1) corresponding to the emitters of said first and second transistors of said cells in the vicinity of said at least one dummy cell, first and second regions of said second conduction type (n1, n2) respectively corresponding to the bases of said first and second transistors, a second region of said first conduction type (p2) corresponding to the collector of said first transistor and to the base of said third transistor, a third region of said first conduction type (p3) corresponding to the collector of said second transistor and to the base of said fourth transistor, and third and fourth regions of said second conduction type (ne, n4) corresponding to the collectors of said third and fourth transistors, respectively, and means for connecting said collectors of said first and second transistors to said collectors of said fourth and third transistors, respectively.

10. A semiconductor integrated circuit device having an array of integrated injection logic memory cells, formed with semiconductor material, said cells being selectively connected to respective first and second word lines and first and second bit lines to define lines of said cells in said array, each said integrated injection logic memory cell comprised of first and second transistors having emitters of a first conduction type with a common emitter forming an injector of the cell, a pair of third and fourth transistors having emitters of a second conduction type opposite said first type and having collectors respectively connected to the collectors of said first and second transistors, said injector being connected to the respective first word line, said third transistor having its base connected to the collector of said fourth transistor and said fourth transistor having its base connected to the collector of said third transistor, said first and second transistors having their bases connected in common to the emitters of said third and fourth transistors and to the respective second word line, and means for providing a write current selectively to said cells, said semiconductor integrated circuit device further comprising means for equalizing said injection current to each of said cells, near the ends of said lines of said array, said means comprising
a bulk portion of said semiconductor material comprising each said second word line, and
at least one dummy cell at the end of each said line of said memory cell array, each said dummy cell comprising means for shunting a respective portion of said write current corresponding to any of said integrated injection logic memory cells that are selected near dummy cell.

11. The device of claim 10, said injection current equalizing means comprising at least one of said dummy cells at the ends of said lines of said array, each said dummy cell having a configuration corresponding to said transistors of each said memory cell.

12. The device of claim 11, comprising at least two of said dummy cells at the ends of each said line of said array, each said dummy cell having the corresponding injector equal to that of each said memory cell.

13. The device of claim 11, each said dummy cell having the injector area larger than that of each said memory cell.

14. The device of claim 12 consisting of a single dummy cell at each end of each said line.

15. The device of claim 11, said correspondence relating said transistors of each said memory cell to three transistors in said dummy cell, two of said transistors having a common emitter corresponding to said injector of each said memory cell.

16. The device of claim 15, comprising one of said dummy cells at each end of each line of said array, said common emitter area of said two transistors of each said dummy cell comprising a larger area than that of said injector of each said memory cell.

17. The device of claim 11, said correspondence relating said transistors of each said memory cell to a diode to each said dummy cell.

18. The device of claim 18 comprising a single dummy cell at each end of each line of said array, each said diode comprising an injector area that is larger than the corresponding area of said memory cell injector.

19. The device of claim 10, said injection current equalizing means comprising means to equalize the write threshold current and the width of the write pulse of each said memory cell of said array.

* * * * *

UNITED STATES PATENT AND TRADEMARK OFFICE
CERTIFICATE OF CORRECTION

PATENT NO. : 4,228,525

DATED : October 14, 1980

INVENTOR(S) : Kawarada et al.

It is certified that error appears in the above—identified patent and that said Letters Patent is hereby corrected as shown below:

Please correct Fig. 1A by inserting the two junction marks as shown in red and by the leaders below:

Fig. 1A

UNITED STATES PATENT AND TRADEMARK OFFICE
CERTIFICATE OF CORRECTION

PATENT NO. : 4,228,525

DATED : October 14, 1980

INVENTOR(S) : Kawarada et al.

It is certified that error appears in the above—identified patent and that said Letters Patent is hereby corrected as shown below:

Column 2, line 23, "is" (second occurrence) should be --and--;
          line 44, delete "a";
          line 45, before "semiconductor" insert --the--.
Column 3, line 50, "RH" should be --Rh--.
Column 5, line 1, "transistor" should be --transistors--;
          line 27, "FIGS." should be --FIG.--;
          line 43, "can not" should be --cannot--.
Column 6, line 39, delete "is";
          line 51, "said" should be --said line--.
Column 7, line 10, "transistors" should be --transistor--;
          line 40, "(ne, n4)" should be --(n3, n4)--.
Column 8, line 21, after "near" insert --said--.

Signed and Sealed this

Seventh Day of April 1981

[SEAL]

Attest:

RENE D. TEGTMEYER

Attesting Officer      Acting Commissioner of Patents and Trademarks